United States Patent
Dede et al.

(10) Patent No.: US 10,347,601 B1
(45) Date of Patent: Jul. 9, 2019

(54) POWER ELECTRONICS ASSEMBLIES WITH METAL INVERSE OPAL BONDING, ELECTRICAL CONTACT AND COOLING LAYERS, AND VEHICLES INCORPORATING THE SAME

(71) Applicant: Toyota Motor Engineering & Manufacturing North America, Inc., Erlanger, KY (US)

(72) Inventors: Ercan Mehmet Dede, Ann Arbor, MI (US); Shailesh N. Joshi, Ann Arbor, MI (US)

(73) Assignee: Toyota Motor Engineering & Manufacturing North America, Plano, TX (US)

( * ) Notice: Subject to any disclaimer, the term of this patent is extended or adjusted under 35 U.S.C. 154(b) by 0 days.

(21) Appl. No.: 15/882,216

(22) Filed: Jan. 29, 2018

(51) Int. Cl.
  *H01L 23/46* (2006.01)
  *H01L 23/48* (2006.01)
  *H01L 23/00* (2006.01)
  *H01L 23/488* (2006.01)

(52) U.S. Cl.
  CPC ............ *H01L 24/32* (2013.01); *H01L 23/46* (2013.01); *H01L 23/488* (2013.01); *H01L 23/564* (2013.01); *H01L 24/83* (2013.01); *H01L 2924/35121* (2013.01)

(58) Field of Classification Search
  CPC ....... H01L 24/32; H01L 23/488; H01L 24/83; H01L 23/46; H01L 23/564; H01L 2924/35121
  USPC .......................................... 257/690; 361/702
  See application file for complete search history.

(56) References Cited

U.S. PATENT DOCUMENTS

| 6,397,450 B1 | 6/2002 | Ozmat |
| 9,257,365 B2 | 2/2016 | Joshi |
| 9,272,899 B2 | 3/2016 | Kotlanka et al. |
| 2005/0139996 A1* | 6/2005 | Myers ................ H01L 23/473 257/712 |
| 2012/0212907 A1* | 8/2012 | Dede ................ H01L 23/4735 361/702 |

(Continued)

OTHER PUBLICATIONS

Zhang, Chi et al., "Characterization of the capillary performance of copper inverse opals", Jun. 3, 2016; URL: http://www.ieeexplore.ws/document/7517661/.

(Continued)

*Primary Examiner* — Caleen O Sullivan
(74) *Attorney, Agent, or Firm* — Dinsmore & Shohl LLP (57) ABSTRACT

A power electronics assembly includes a substrate, a semiconductor device and a metal inverse opal (MIO) bonding layer positioned between and bonded to the substrate and the semiconductor device. A first electrode is disposed on a first surface, a second electrode is disposed on a second surface, and a third electrode is disposed on a third surface. The first surface may be a top surface of the semiconductor device, the second surface may be a bottom surface of the semiconductor device, the third surface may be spaced apart from the bottom surface of the semiconductor device, and the second electrode is in electrical communication with the third electrode through the MIO bonding layer. A cooling fluid circuit with a cooling fluid inlet, a cooling fluid outlet and a cooling fluid path through the MIO bonding layer may be included.

20 Claims, 6 Drawing Sheets

(56) References Cited

U.S. PATENT DOCUMENTS

2013/0020719 A1    1/2013  Jung et al.
2013/0037959 A1*  2/2013  Nguyen ................ H01L 23/147
                                                                257/774

OTHER PUBLICATIONS

Dusseault, Thomas J., "Inverse opals for fluid delivery in electronics cooling systems"; URL: https://nanoheat.stanford.edu/sites/default/files/publications/dusseault_final.pdf.
Barako, Michael T. et al, "Thermal conduction in nanoporous copper inverse opal films", May 30, 2014, URL: http://ieeexplore.ieee.org/document/6892354/?part=1.
Dumé, Belle, "Heat conduction goes ballistic in opals", URL: http://nanotechweb.org/cws/article/tech/64569.

* cited by examiner

POWER ELECTRONICS ASSEMBLIES WITH METAL INVERSE OPAL BONDING, ELECTRICAL CONTACT AND COOLING LAYERS, AND VEHICLES INCORPORATING THE SAME

TECHNICAL FIELD

The present specification generally relates to power electronics assemblies, and more particularly, power electronics assemblies with bonding layers that provide electrical contact between electrodes, cooling of semiconductor devices and thermal stress compensation between semiconductor devices bonded to substrates during the manufacture of power electronics assemblies.

BACKGROUND

Power electronics devices are often utilized in high-power electrical applications, such as inverter systems for hybrid electric vehicles and electric vehicles. Such power electronics devices may be vertical current devices that include an electrode on an upper surface and an electrode on a lower surface of power semiconductor devices such as power insulated-gate bipolar transistors (IGBTs) and power transistors. The power semiconductor devices may be thermally bonded to a substrate and the substrate may then be further thermally bonded to a cooling structure, such as a heat sink.

With advances in battery technology and increases in electronics device packaging density, operating temperatures of power electronics devices have increased and are currently approaching 200° C. Accordingly, cooling of power electronics devices is desired. Also, traditional electronic device soldering techniques no longer provide suitable bonding of semiconductor devices to substrates and alternative bonding techniques are needed. One such alternative bonding technique is transient liquid phase (TLP) sintering. TLP sintering of semiconductor devices to substrates utilize bonding temperatures (also referred to as sintering temperatures) between about 280° C. to about 350° C. The semiconductor devices and substrates have different coefficients of thermal expansion (CTE) and large thermally-induced stresses (e.g., cooling stresses) may be generated between a semiconductor device and substrate upon cooling from a TLP sintering temperature. The large thermal cooling stresses due to CTE mismatch between the power semiconductor device and substrate may result in delamination between the semiconductor device and substrate of a power electronics device.

SUMMARY

In one embodiment, a power electronics assembly includes a substrate, a semiconductor device and a metal inverse opal (MIO) bond layer positioned between and bonded to the substrate and the semiconductor device. A frame may extend from a top surface of the substrate and the semiconductor device may be disposed within the frame. A first electrode is disposed on a first surface, a second electrode is disposed on a second surface, and a third electrode is disposed on a third surface. The first surface may be a top surface of the semiconductor device, the second surface may be a bottom surface of the semiconductor device, the third surface is spaced apart from the second surface, and the second electrode is in electrical communication with the third electrode through the MIO bonding layer. A cooling fluid circuit with a cooling fluid inlet, a cooling fluid outlet and the MIO bonding layer may be included. Also, the cooling fluid circuit may be configured for a cooling fluid to enter the power electronics assembly through the cooling fluid inlet, flow through the MIO bonding layer, and exit the power electronics assembly through the cooling fluid outlet. In embodiments, the MIO bonding layer is positioned between and transient liquid phase bonded to the second electrode and a top surface of the substrate.

In some embodiments, the third surface is a bottom surface of the substrate and at least one electrically conductive through via may extend through the substrate from the MIO bonding layer to the third electrode. In such embodiments, the cooling fluid inlet and the cooling fluid outlet may extend through the substrate and the cooling fluid circuit is configured for fluid to flow into the MIO bonding layer through a first end and/or first side of the MIO bonding layer and exit the MIO bonding layer through a second end and/or second side of the MIO bonding layer. In the alternative, the cooling fluid inlet and the cooling fluid outlet may extend between a frame and the semiconductor device and the cooling fluid circuit is configured for fluid to flow into the MIO bonding layer through a first end and/or first side of the MIO bonding layer and exit the MIO bonding layer through a second end and/or second side of the MIO bonding layer. In other embodiments, the second surface is a top surface of a frame extending from a top surface of the substrate and an electrically conductive layer extends from between the substrate and the MIO bonding layer to the top surface of the frame. In such embodiments, the cooling fluid inlet may extend through the substrate and the cooling fluid circuit is configured for fluid to flow through the cooling fluid inlet into a bottom surface of the MIO bonding layer and exit the MIO bonding layer through at least one end and/or one side of the MIO bonding layer.

In another embodiment, a power electronics assembly includes a substrate with a top surface and a bottom surface, a frame disposed on the top surface of the substrate, a semiconductor device extending across the top surface of the substrate, and a metal inverse opal (MIO) layer positioned between and bonding together the substrate and the semiconductor device. A first electrode is disposed on a first surface and is in electrical communication with the semiconductor device, a second electrode is disposed on a second surface and is in electrical communication with the semiconductor device, and a third electrode is disposed on a third surface. The first surface may be a top surface of the semiconductor device, the second surface may be a bottom surface of the semiconductor device, the third surface is spaced apart from the second surface, and the second electrode is in electrical communication with the third electrode through the MIO bonding layer. A cooling fluid circuit with a cooling fluid inlet, a cooling fluid outlet, and the MIO bonding layer may be included.

In some embodiments, the third electrode is disposed on a bottom surface of the substrate and at least one electrically conducting through via extends through the substrate from the MIO bonding layer to the third electrode. In such embodiments, the cooling fluid inlet may extend between the frame and the semiconductor device and the cooling fluid circuit is configured for a cooling fluid to flow into the MIO bonding layer through a first end and/or first side of the MIO bonding layer and exit the MIO bonding layer through a second end and/or second side of the MIO bonding layer. In other embodiments, the cooling fluid inlet may extend through the substrate and the cooling fluid circuit is configured for the cooling fluid to flow into the MIO bonding layer through a first end and/or first side of the MIO bonding layer and exit the MIO bonding layer through a second end and/or second side of the MIO bonding layer.

In other embodiments, the third electrode is disposed on an electrically conductive layer extending from between the substrate and the MIO bonding layer to a top surface of the frame. In such embodiments, the cooling fluid inlet may extend through the substrate and the cooling fluid circuit is configured for fluid to flow through the cooling fluid inlet into a bottom surface of the MIO bonding layer and exit the MIO bonding layer through at least one end and/or one side of the MIO bonding layer.

In another embodiment, a process for manufacturing a power electronics assembly includes positioning a metal inverse opal (MIO) layer between a substrate and a semiconductor device to provide a substrate/semiconductor device assembly. The substrate/semiconductor device assembly is heated to a transient liquid phase (TLP) sintering temperature between about 280° C. and 350° C. and the MIO bonding layer is TLP bonded between and to the metal substrate and the semiconductor device. The TLP bonded substrate/semiconductor device assembly is cooled from the TLP sintering temperature to ambient temperature and a first electrode is disposed on a first surface, a second electrode is disposed on a second surface, and a third electrode is disposed on a third surface to form the power electronics assembly. The first surface may be a top surface of the semiconductor device, the second surface may be a bottom surface of the semiconductor device, the third surface is spaced apart from the second surface, and the second electrode is in electrical communication with the third electrode through the MIO bonding layer. In some embodiments, the third surface may be a bottom surface of the substrate and the substrate may include at least one electrically conductive through via extending from the bottom surface of the MIO bonding layer to the third electrode. In other embodiments the third surface may be an electrically conductive layer disposed on a top surface of a frame and the cooling fluid circuit is configured for the cooling fluid to flow through the cooling fluid inlet into a bottom surface of the MIO bonding layer and exit the MIO bonding layer through at least one end and/or one side of the MIO bonding layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

One non-limiting example of a power electronics assembly includes a power semiconductor device (semiconductor device) thermally bonded to a substrate with a metal inverse opal (MIO) layer. A first electrode is disposed on a top surface of the semiconductor device, a second electrode is disposed on a lower surface of the semiconductor device, a third electrode is disposed on a bottom surface of a substrate, and the second electrode is in electrical contact with the third electrode through the MIO bonding layer. The MIO layer has a predetermined stiffness and a predetermined thermal conductivity that may compensate for thermally induced stress between the substrate and the semiconductor device generated during manufacture and/or provide cooling of the semiconductor device during operation of the power electronics assembly. The power electronics assembly includes a cooling fluid circuit with a cooling fluid inlet, a cooling fluid outlet and a cooling fluid path extending through the MIO bonding layer. Cooling fluid enters the power electronics assembly through the cooling fluid inlet, flows through the MIO bonding layer, and exits the power electronics assembly through the cooling fluid outlet thereby removing heat from the semiconductor device. Accordingly, the MIO bonding layer provides a three-fold functionality for the power electronics device. Particularly, the MIO layer provides a thermal stress compensation bonding layer between the semiconductor device and the substrate, an electrically conductive layer between the first electrode and the second electrode, and a thermally conductive cooling layer for the power electronics assembly.

Figure 1:
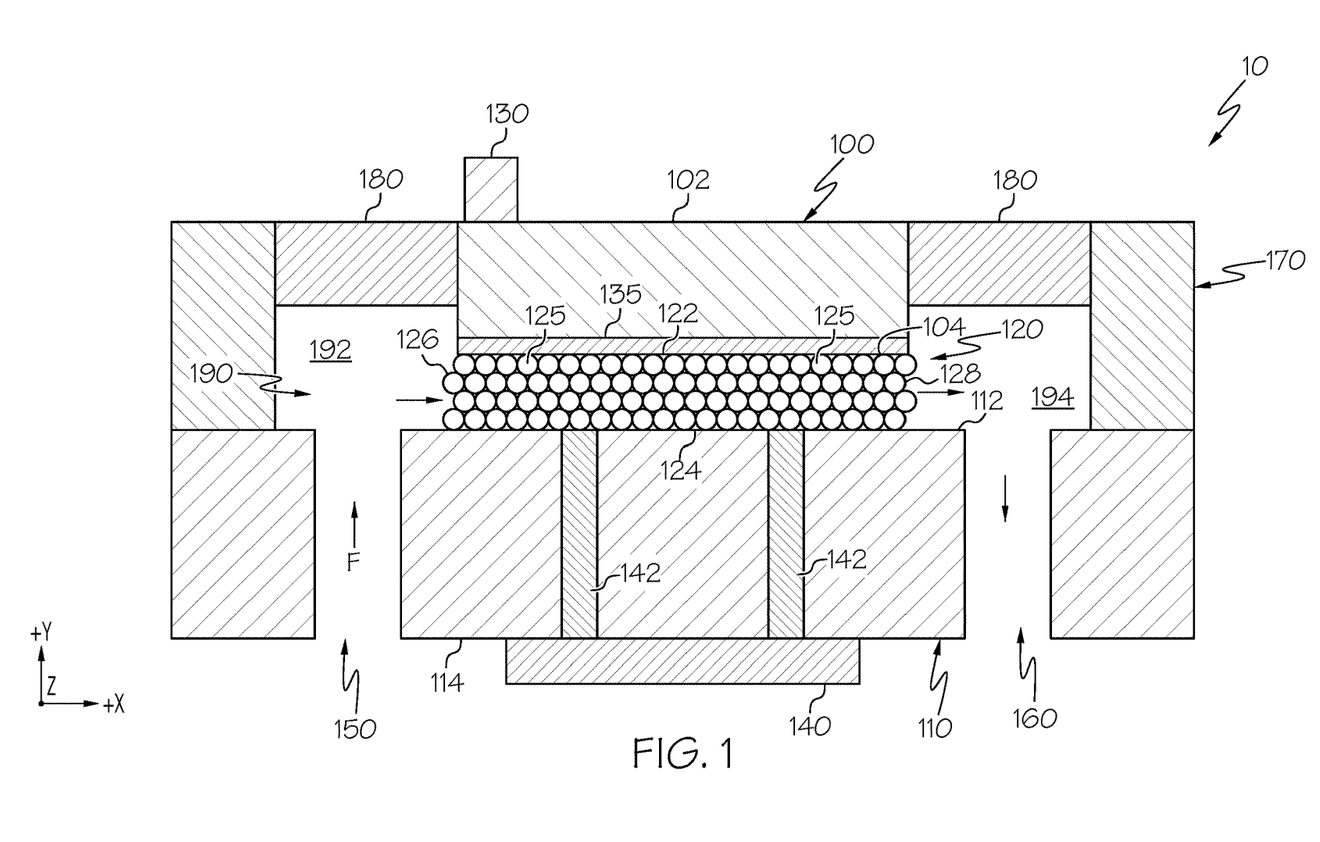
FIG. 1 schematically depicts a side view of a power electronics assembly having a power semiconductor device thermally bonded to a substrate with a metal inverse opal layer that provides electrical contact between electrodes and cooling of the power semiconductor device according to one or more embodiments shown and described herein.

Referring initially to FIG. 1, a non-limiting example of a power electronics assembly 10 is illustrated. The example power electronics assembly 10 generally comprises a semiconductor device 100 with a top surface 102 and a bottom surface 104, and a substrate 110 with a top surface 112 and a bottom surface 114. An MIO bonding layer 120 with a top surface 122 and a bottom surface 124 is positioned between and bonded to the semiconductor device 100 and the substrate 110. In some embodiments, the MIO bonding layer 120 is transient liquid phase (TLP) bonded to the semiconductor device 100 and the substrate 110. In other embodiments, soldering or brazing may be used to thermally bond the MIO bonding layer 120 to the semiconductor device 100 and the substrate 110. In still other embodiments, electrolytic or electroless bonding may be used bond the MIO bonding layer 120 to the semiconductor device 100 and the substrate 110.

A first electrode 130, e.g., a top electrode, may be disposed on a first surface, a second electrode 135, e.g., an intermediate electrode, may be disposed on a second surface, and a third electrode 140, e.g., a bottom electrode, may be dispose on a third surface. Non-limiting examples of the first, second and third surfaces include the top surface 102 of the semiconductor device 100, the bottom surface 104 of the semiconductor device 100, and the bottom surface 114 of the substrate 110, respectively. The top surface 122 of the MIO bonding layer 120 may be in direct contact with and bonded to the second electrode 135 and the bottom surface 124 may be in direct contact with and bonded to the top surface 112 of the substrate 110. In the alternative, the top surface 122 may be bonded to but not be in direct contact with the second electrode 135 and the bottom surface 124 may be bonded to but not be in direct contact with the top surface 112 of the substrate 110. For example, one or more bonding layers and/or intermetallic layers (not shown) may be disposed between the top surface 122 of the MIO bonding layer 120 and the second electrode 135 and/or between the bottom surface 124 of the MIO bonding layer 120 and the top surface 112 of the substrate 110. At least one electrically conductive through via 142 extends through the substrate 110 between the top surface 112 and the bottom surface 114. A frame 170 may be disposed on the top surface 112 of the substrate 110 and the semiconductor device 100 may be disposed at least partially within the frame 170. That is, the frame 170 may be spaced apart from and extend around at least a portion of the semiconductor device 100. Positioned between the frame 170 and the semiconductor device 100 may be at least one seal 180. While FIG. 1 depicts the substrate 110 and the frame 170 as separate components, it should be appreciated that the substrate 110 and the frame 170 may be formed as a single component to house the semiconductor device 100.

The thicknesses of the semiconductor device 100 and the substrate 110 may depend on the intended use of the power electronics assembly 10. In one embodiment, the semiconductor device 100 has a thickness within the range of about 0.1 mm to about 0.3 mm and the substrate 110 has a thickness within the range of about 2.0 mm to about 4.0 mm. For example and without limitation, the semiconductor device 100 may have a thickness of about 0.2 mm and the substrate 110 may have a thickness of about 3.0 mm. It should be understood that other thicknesses may be utilized.

The semiconductor device 100, and other semiconductor devices disclosed herein, may be formed from a wide band gap semiconductor material suitable for the manufacture or production of power semiconductor devices such as power IGBTs and power transistors. In embodiments, the semiconductor device 100 may be formed from wide band gap semiconductor materials. Non-limiting examples of such wide band gap semiconductor materials include silicon carbide (SiC), silicon dioxide ($SiO_2$), aluminum nitride (AlN), gallium nitride (GaN), gallium oxide ($Ga_2O_3$), boron nitride (BN), diamond, and the like. The substrate 110, and other substrates disclosed herein, may be formed from any suitable dielectric or semiconductor material such that the second electrode is not in electrical contact with the MIO bonding layer 120 except through the at least one electrically conductive through vias 142. Non-limiting examples of such dielectric or semiconductor materials include glass, alumina ($Al_2O_3$), mullite ($3Al_2O_3.2SiO_2$), sapphire, silica ($SiO_2$), silicon (Si) and the like. The electrically conductive through vias 142, and other electrically conductive vias disclosed herein, may be formed from any suitable electrically conductive material that provides an electric pathway through the substrate 110. Non-limiting examples of such electrically conductive materials include carbon (C), Cu, Ag, Au, and alloys thereof. In embodiments, the semiconductor device 100 and the substrate 110 may comprise a coating, e.g., nickel (Ni) plating, to assist in the TLP sintering of the semiconductor device 100 to the substrate 110.

Figure 2:
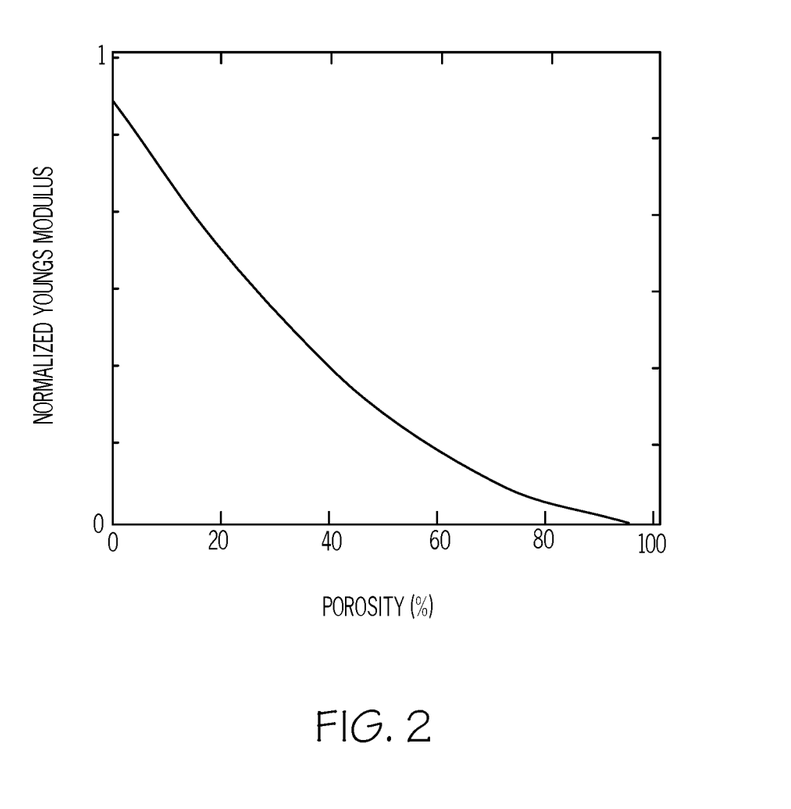
FIG. 2 graphically depicts normalized Young's modulus as a function of porosity in a metal inverse opal layer.

The MIO bonding layer 120 has a plurality of hollow spheres 125 and a predefined porosity that provides a stiffness and a thermal conductivity for the MIO bonding layer 120. That is, in embodiments, a stiffness and a thermal conductivity for the MIO bonding layer 120 are a function of the porosity, i.e., the amount of porosity, of the MIO bonding layer 120. As used herein, the term stiffness refers to the elastic modulus (also known as Young's modulus) of a material, i.e., a measure of a material's resistance to being deformed elastically when a force is applied to the material. FIG. 2 graphically depicts the Young's modulus of a MIO bonding layer as a function of porosity. It should be understood that the thermal conductivity of a MIO bonding layer as a function of porosity obeys the same trend or relationship as the Young's modulus as depicted in FIG. 2. Accordingly, the stiffness and the thermal conductivity of the MIO bonding layer 120 can be varied and controlled to accommodate thermal stress for a given semiconductor device 100—substrate 110 combination and/or provided a desired heat removal rate for a given semiconductor device 100—substrate 110 combination. Also, a graded stiffness and/or graded thermal conductivity along the thickness of the MIO bonding layer 120 can be provided to accommodate thermal stress for a given semiconductor device 100—substrate 110 combination.

The MIO bonding layer 120 may be formed by depositing metal within a sacrificial template of packed microspheres and then dissolving the microspheres to leave a skeletal network of metal with a periodic arrangement of interconnected hollow spheres 125 which may or may not be etched to increase the porosity and interconnection of the hollow spheres. The skeletal network of metal has a large surface area and the amount of porosity of the MIO bonding layer 120 can be varied by changing the size of the sacrificial microspheres. Also, the size of the microspheres and thus the size of the hollow spheres 125 can be varied as a function of thickness (Y direction) of the MIO bonding layer 120 such that a graded porosity, i.e., graded hollow sphere diameter, is provided as a function of thickness. The size (diameter) of the hollow spheres 125 of the MIO bonding layer 120 can be between about 50 micrometers (μm) and about 1,000 μm. In embodiments, the size of the hollow spheres is between about 100 μm and about 750 μm, for example, between about 200 μm and about 650 μm.

The MIO bonding layer 120, and other MIO bonding layers disclosed herein, may be formed from any electrically conductive material that can be electrolytically or electrolessly deposited within a sacrificial template of packed microspheres. Non-limiting examples include copper (Cu), aluminum (Al), nickel (Ni), iron (Fe), zinc (Zn), alloys thereof, and the like. As used herein, the term "alloys thereof" refers to alloys not limited to the elements listed unless otherwise stated. For example, a Cu alloy as disclosed herein may include an alloy formed from Cu and elements other than Al, Ni, Fe, and Zn. In the alternative, a Cu alloy as disclosed herein may include an alloy formed from Cu with Al, Ni, Fe and/or Zn, plus additional elements. In another alternative, a Cu alloy as disclosed herein may include an alloy formed from only Cu and Al, Ni, Fe and/or Zn plus any incidental impurities present from manufacturing of the Cu alloy. The first electrode 130, the second electrode 135, the third electrode 140, and other electrodes disclosed herein, may be formed from any electrically conductive material suitable for use as a power electronics device electrode. Non-limiting examples include Cu, Al, silver (Ag), gold (Au), alloys thereof, and the like.

As noted above, the MIO bonding layer 120 is formed from a skeletal network of metal. Accordingly, the MIO bonding layer 120 is electrically conductive and provides an electrically conductive path between the first electrode 130 and the third electrode 140. That is, electrical current flows form the first electrode 130 to the third electrode 140 via the flow of electrons from the first electrode 130, through the semiconductor device 100, through the second electrode 135, through the MIO bonding layer 120, through the at least one electrically conductive through via 142 to the third electrode 140. It should be understood that electrical current will also flow through any bonding layers and/or intermetallic layers disposed between the MIO bonding layer 120 and the semiconductor device 100 and/or between the MIO bonding layer 120 and the substrate 110.

Also noted above are the interconnected hollow spheres 125 of the MIO bonding layer 120. Accordingly, the MIO bonding layer 120 has an open porous structure through which fluid can flow and the MIO bonding layer 120 may be part of a cooling fluid circuit for the power electronics assembly 10. Particularly, in embodiments, a cooling fluid circuit (not labeled) includes a cooling fluid inlet 150 extending from the bottom surface 114 to the top surface 112 of the substrate 110, an internal cooling fluid chamber 190, and a cooling fluid outlet 160 extending from the top surface 112 to the bottom surface 114 of the substrate 110. The internal cooling fluid chamber 190 comprises an inlet cooling chamber 192, the interconnected hollow spheres 125 of the MIO bonding layer 120, and an outlet cooling chamber 194. As depicted by the arrows in FIG. 1, a cooling fluid 'F' may be included and flow into the power electronics assembly 10 through the cooling fluid inlet 150. The frame 170 and the at least one seal 180 prevent the cooling fluid F from flowing up (+Y direction) past the semiconductor device 100 thereby ensuring the cooling fluid F flowing through the cooling fluid inlet 150 and into the inlet cooling chamber 192 enters the MIO bonding layer 120 through a first end 126. The cooling fluid F flows through and exits the MIO bonding layer 120 through a second end 128 and into the outlet cooling chamber 194. Other flow paths and configurations through the MIO bonding layer 120, and other MIO bonding layers described herein, may be utilized as described in greater detail below. After flowing through the MIO bonding layer 120 and into the outlet cooling chamber 194, the cooling fluid F exits the power electronics assembly 10 by flowing through the cooling fluid outlet 160. It should be understood that flow of the cooling fluid F through the cooling fluid circuit is configured to remove heat from the semiconductor device 100. Non-limiting examples of the cooling fluid CF include dielectric cooling fluids such as aromatics, silicate-ester, aliphatics, silicones, fluorocarbons, and the like.

Accordingly, the MIO bonding layer 120 provides a thermal stress compensation layer between the semiconductor device 100 and the substrate 110, an electrically conductive path between the first electrode 130 and the third electrode 140, and a thermally conductive cooling layer for the semiconductor device 100.

Figure 3:
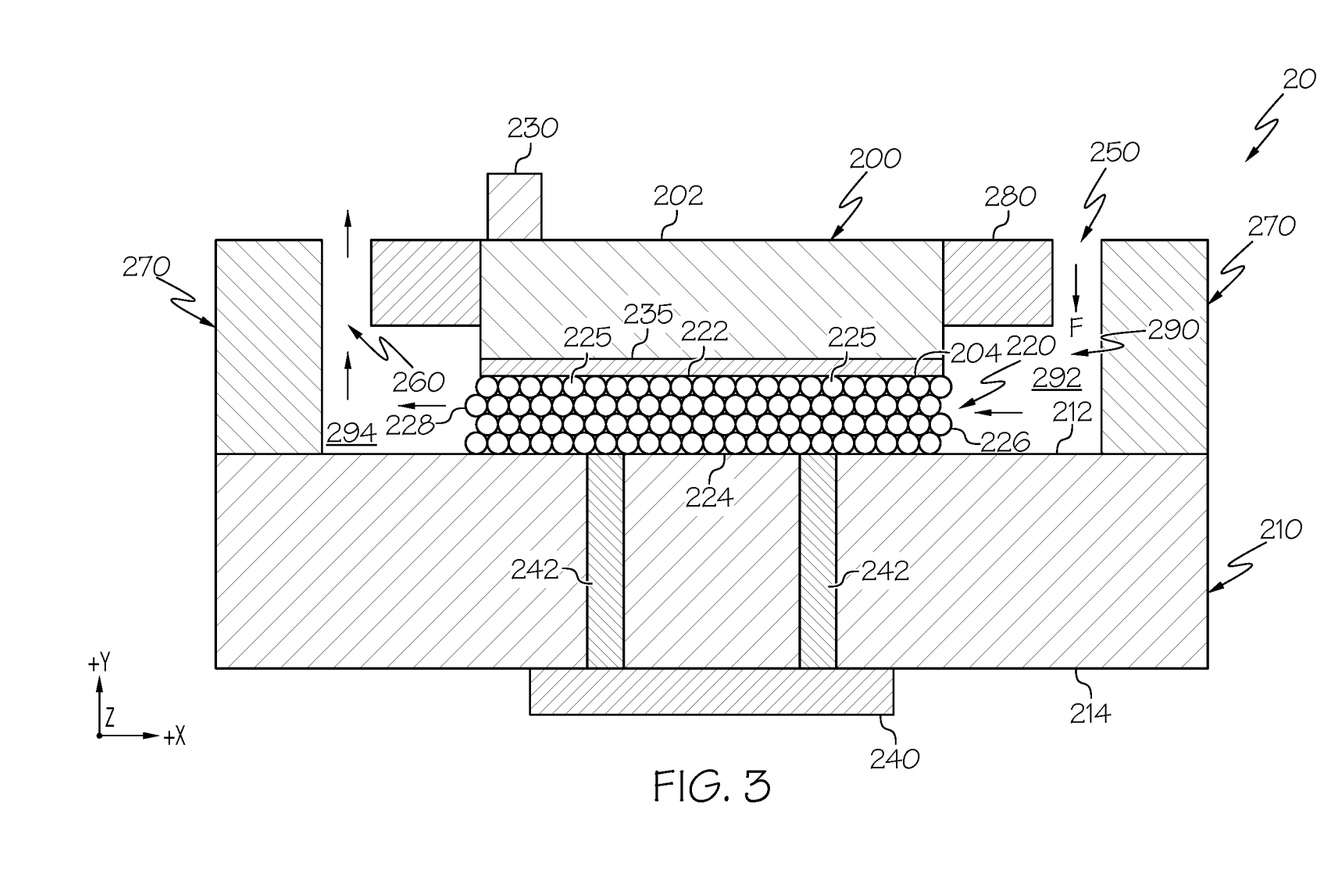
FIG. 3 schematically depicts a side view of a power electronics assembly having a power semiconductor device thermally bonded to a substrate with a metal inverse opal layer that provides electrical contact between electrodes and cooling of the power semiconductor device according to one or more embodiments shown and described herein.

Referring now to FIG. 3, another example power electronics assembly 20 is illustrated. The power electronics assembly 20 generally comprises a semiconductor device 200 with a top surface 202 and a bottom surface 204, and a substrate 210 with a top surface 212 and a bottom surface 214. An MIO bonding layer 220 with a top surface 222 and a bottom surface 224 is positioned between and bonded to the semiconductor device 200 and the substrate 210. In some embodiments, the MIO bonding layer 220 is transient liquid phase (TLP) bonded to the semiconductor device 200 and the substrate 210. In other embodiments, soldering or brazing may be used to thermally bond the MIO bonding layer 220 to the semiconductor device 200 and the substrate 210. In still other embodiments, electrolytic or electroless bonding may be used to bond the MIO bonding layer 220 to the semiconductor device 200 and the substrate 210.

A first electrode 230, e.g., a top electrode, may be disposed on a first surface, a second electrode 235, e.g., an intermediate electrode, may be disposed on a second surface, and a third electrode 240, e.g., a bottom electrode, may be dispose on a third surface. Non-limiting examples of the first, second and third surfaces include the top surface 202 of the semiconductor device 200, the bottom surface 204 of the semiconductor device 200, and the bottom surface 214 of the substrate 210, respectively. The top surface 222 of the MIO bonding layer 220 may be in direct contact with and bonded to the second electrode 235 and the bottom surface 224 may be in direct contact with and bonded to the top surface 212 of the substrate 210. In the alternative, the top surface 222 may be bonded to but not be in direct contact with the second electrode 235 and the bottom surface 224 may be bonded to but not be in direct contact with the top surface 212 of the substrate 210. For example, one or more bonding layers and/or intermetallic layers (not shown) may be disposed between the top surface 222 of the MIO bonding layer 220 and the second electrode 235 and/or between the bottom surface 224 of the MIO bonding layer 220 and the top surface 212 of the substrate 210. In embodiments, the semiconductor device 200 and the substrate 210 may comprise a coating, e.g., Ni plating, to assist in the TLP sintering of the semiconductor device 200 to the substrate 210.

At least one electrically conductive through via 242 extends through the substrate 210 between the top surface 212 and the bottom surface 214. A frame 270 may be disposed on the top surface 212 of the substrate 210 and the semiconductor device 200 may be disposed at least partially within the frame 270. That is, the frame 270 may be spaced apart from and extend around at least a portion of the semiconductor device 200. Positioned between the frame 270 and the semiconductor device 200 may be at least one seal 280. While FIG. 1 depicts the substrate 210 and the frame 270 as separate components, it should be appreciated that the substrate 210 and the frame 270 may be formed as a single component to house the semiconductor device 200.

The thicknesses of the semiconductor device 200 and the substrate 210 may depend on the intended use of the power electronics assembly 20. In one embodiment, the semiconductor device 200 has a thickness within the range of about 0.1 mm to about 0.3 mm and the substrate 210 has a thickness within the range of about 2.0 mm to about 4.0 mm, For example and without limitation, the semiconductor device 200 may have a thickness of about 0.2 mm and the substrate 210 may have a thickness of about 3.0 mm. It should be understood that other thicknesses may be utilized.

Similar to the MIO bonding layer 120 discussed above, the MIO bonding layer 220 has a plurality of hollow spheres 225, a predefined porosity that provides a stiffness and predefined thermal conductivity for the MIO bonding layer 220. That is, in embodiments, a stiffness and a thermal conductivity for the MIO bonding layer 220 are a function of the porosity, i.e., the amount of porosity, of the MIO bonding layer 220. Accordingly, the stiffness and/or the thermal conductivity of the MIO bonding layer 220 can be varied and controlled to accommodate thermal stress for a given semiconductor device 200—substrate 210 combination and/or provided a desired heat removal rate for a given semiconductor device 200—substrate 210 combination. Also, a graded stiffness and/or a graded thermal conductivity along the thickness of the MIO bonding layer 220 can be provided to accommodate thermal stress for a given semiconductor device 200—substrate 210 combination.

The MIO bonding layer 220 may be formed by depositing metal within a sacrificial template of packed microspheres and then dissolving the microspheres to leave a skeletal network of metal with a periodic arrangement of interconnected hollow spheres 225 which may or may not be etched to increase the porosity and interconnection of the hollow spheres. The skeletal network of metal has a large surface area and the amount of porosity of the MIO bonding layer 220 can be varied by changing the size of the sacrificial microspheres. Also, the size of the microspheres and thus the size of the hollow spheres 225 can be varied as a function of thickness (Y direction) of the MIO bonding layer 220 such that a graded porosity, i.e., graded hollow sphere diameter, is provided as a function of thickness. The size (diameter) of the hollow spheres 225 of the MIO bonding layer 220 can be between about 50 micrometers (μm) and about 1,000 μm. In embodiments, the size of the hollow spheres is between about 100 μm and about 750 μm, for example, between about 200 μm and about 650 μm.

As noted above, the MIO bonding layer 220 is formed from a skeletal network of metal. Accordingly, the MIO bonding layer 220 is electrically conductive and provides an electrically conductive path between the first electrode 230 and the third electrode 240. That is, electrical current flows form the first electrode 230 to the third electrode 240 via the flow of electrons from the first electrode 230, through the semiconductor device 200, through the second electrode 235, through the MIO bonding layer 220, through the at least one electrically conductive through via 242 to the second electrode 240. It should be understood that electrical current will also flow through any bonding layers and/or intermetallic layers disposed between the MIO bonding layer 220 and the semiconductor device 200 and/or between the MIO bonding layer 220 and the substrate 210.

Also noted above are the interconnected hollow spheres 225 of the MIO bonding layer 220. Accordingly, the MIO bonding layer 220 has an open porous structure through which fluid can flow and the MIO bonding layer 220 may be part of a cooling fluid circuit for the power electronics assembly 20. Particularly, in embodiments, a cooling fluid circuit (not labeled) includes a cooling fluid inlet 250 extending between the frame 270 and the at least one seal 280, an internal cooling fluid chamber 190, and a cooling fluid outlet 260 extending between the frame 270 and at least one seal 280. While FIG. 3 depicts the cooling fluid inlet 250 and the cooling fluid outlet 260 extending between the frame 270 and the at least one seal 280, it should understood that the cooling fluid inlet 250 and/or cooling fluid outlet 260 may extend through the at least one seal 280. That is, the at least one seal 280 may extend from the frame 270 to the semiconductor device 200 and the cooling fluid inlet 250 and/or cooling fluid outlet 260 may be enclosed within and extend through the at least one seal 280. The internal cooling fluid chamber 290 comprises an inlet cooling chamber 292, the interconnected hollow spheres 225 of the MIO bonding layer 220, and an outlet cooling chamber 294. As depicted by the arrows in FIG. 3, a cooling fluid 'F' may be included and flow into the power electronics assembly 20 through the cooling fluid inlet 250. The frame 270 and the substrate 210 prevent the cooling fluid F from flowing down (−Y direction) past the semiconductor device 200 thereby ensuring the cooling fluid F flowing through the cooling fluid inlet 250 and into the inlet cooling chamber 292 enters the MIO bonding layer 220 through a first end 226. The cooling fluid F flows through and exits the MIO bonding layer 220 through a second end 228 and into the outlet cooling chamber 294. After flowing through the MIO bonding layer 220 and into the outlet cooling chamber 294, the cooling fluid F exits the power electronics assembly 20 by flowing through the cooling fluid outlet 260. It should be understood that flow of the cooling fluid F through the cooling fluid circuit is configured to remove heat from the semiconductor device 200.

Accordingly, the MIO bonding layer 220 provides a thermal stress compensation layer between the semiconductor device 200 and the substrate 210, an electrically conductive path between the first electrode 230 and the second electrode 240, and a thermally conductive cooling layer for the semiconductor device 200.

Figure 4:
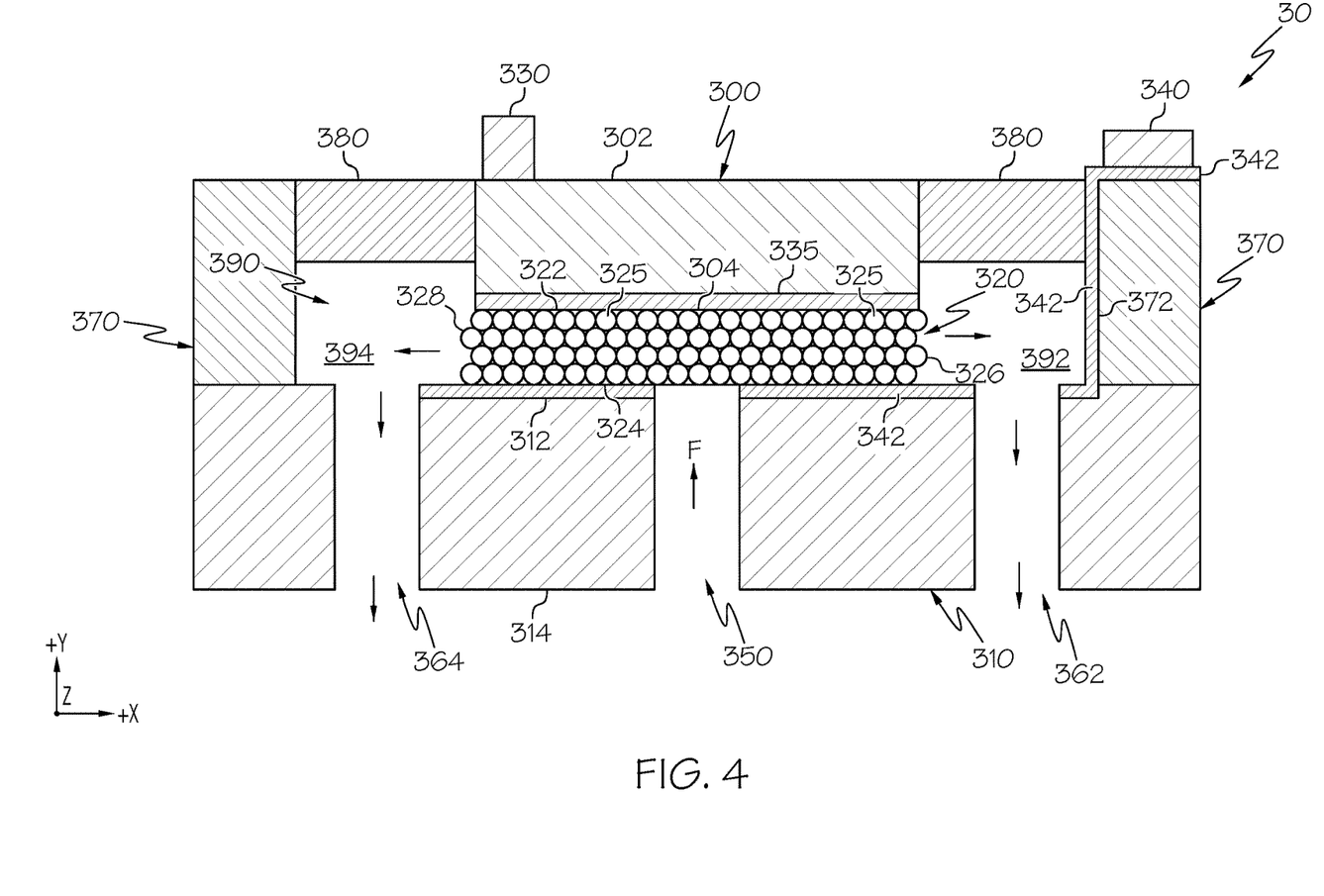
FIG. 4 schematically depicts a side view of a power electronics assembly having a power semiconductor device thermally bonded to a substrate with a metal inverse opal layer that provides electrical contact between electrodes and cooling of the power semiconductor device according to one or more embodiments shown and described herein.

Referring now to FIG. 4, another example power electronics assembly 30 is illustrated. The power electronics assembly 30 generally comprises a semiconductor device 300 with a top surface 302 and a bottom surface 304, and a substrate 310 with a top surface 312 and a bottom surface 314. A frame 370 may be disposed on the top surface 312 of the substrate 310 and the semiconductor device 300 may be disposed at least partially within the frame 370. That is, the frame 370 may be spaced apart from and extend around at least a portion of the semiconductor device 300. Positioned between the frame 370 and the semiconductor device 300 may be at least one seal 380. While FIG. 4 depicts the substrate 310 and the frame 370 as separate components, it should be appreciated that the substrate 310 and the frame 370 may be formed as a single component to house the semiconductor device 300. An electrically conductive layer 342 extends across the top surface 312 of the substrate 310 to a side wall 372 of the frame 370. Also, the electrically conductive layer 342 may extend along and up (+Y direction) of the side wall 372, and along a top surface 374 of the frame as depicted in FIG. 4.

An MIO bonding layer 320 with a top surface 322 and a bottom surface 324 is positioned between and bonded to the semiconductor device 300 and the electrically conductive layer 342. In some embodiments, the MIO bonding layer 320 is transient liquid phase (TLP) bonded to the semiconductor device 300 and the substrate 310. In other embodiments, soldering or brazing may be used to thermally bond the MIO bonding layer 320 to the semiconductor device 300 and the substrate 310. In still other embodiments, electrolytic or electroless bonding may be used bond the MIO bonding layer 320 to the semiconductor device 300 and the substrate 310.

A first electrode 330, e.g., a top electrode, may be disposed on a first surface, a second electrode 335, e.g., an intermediate electrode, may be disposed on a second surface, and a third electrode 340, e.g., a bottom electrode, may be dispose on a third surface. Non-limiting examples of the first, second and third surfaces include the top surface 302 of the semiconductor device 300, the bottom surface 304 of the semiconductor device 300, and the top surface 374 of the frame 370, respectively. The top surface 322 of the MIO bonding layer 320 may be in direct contact with and bonded to the second electrode 335 and the bottom surface 324 may be in direct contact with and bonded to the electrically conductive layer 342 extending across the top surface 312 of the substrate 310. In the alternative, the top surface 322 may be bonded to but not be in direct contact with the second electrode 335 and the bottom surface 324 may be bonded to but not be in direct contact with the electrically conductive layer 342 extending across the top surface 312 of the substrate 310. For example, one or more bonding layers and/or intermetallic layers (not shown) may be disposed between the top surface 322 of the MIO bonding layer 320 and the second electrode 335 and/or between the bottom surface 324 of the MIO bonding layer 320 and the electrically conductive layer 342. In embodiments, the semiconductor device 300 and the electrically conductive layer 342 may comprise a coating, e.g., Ni plating, to assist in the TLP sintering of the MIO bonding layer 320 to the semiconductor device 300 and the electrically conductive layer 342.

The thicknesses of the semiconductor device 300 and the substrate 310 may depend on the intended use of the power electronics assembly 30. In one embodiment, the semiconductor device 300 has a thickness within the range of about 0.1 mm to about 0.3 mm and the substrate 310 has a thickness within the range of about 2.0 mm to about 4.0 mm, For example and without limitation, the semiconductor device 300 may have a thickness of about 0.2 mm and the substrate 310 may have a thickness of about 3.0 mm. It should be understood that other thicknesses may be utilized.

Similar to the MIO bonding layers 120, 220 discussed above, the MIO bonding layer 320 has a plurality of hollow spheres 325 and a predefined porosity that provides a stiffness for the MIO bonding layer 320. That is, in embodiments, a stiffness for the MIO bonding layer 320 is a function of the porosity, i.e., the amount of porosity, of the MIO bonding layer 320. Accordingly, the stiffness of the MIO bonding layer 320 can be varied and controlled to accommodate thermal stress for a given semiconductor device 300—substrate 310 combination. Also, a graded stiffness along the thickness of the MIO bonding layer 320 can be provided to accommodate thermal stress for a given semiconductor device 300—substrate 310 combination.

The MIO bonding layer 320 may be formed by depositing metal within a sacrificial template of packed microspheres and then dissolving the microspheres to leave a skeletal network of metal with a periodic arrangement of interconnected hollow spheres 325 which may or may not be etched to increase the porosity and interconnection of the hollow spheres. The skeletal network of metal has a large surface area and the amount of porosity of the MIO bonding layer 320 can be varied by changing the size of the sacrificial microspheres. Also, the size of the microspheres and thus the size of the hollow spheres 325 can be varied as a function of thickness (Y direction) of the MIO bonding layer 320 such that a graded porosity, i.e., graded hollow sphere diameter, is provided as a function of thickness. The size (diameter) of the hollow spheres 325 of the MIO bonding layer 320 can be between about 50 micrometers ($\mu$m) and about 1,000 $\mu$m. In embodiments, the size of the hollow spheres is between about 100 $\mu$m and about 750 $\mu$m, for example, between about 200 $\mu$m and about 650 $\mu$m.

As noted above, the MIO bonding layer 320 is formed from a skeletal network of metal. Accordingly, the MIO bonding layer 320 is electrically conductive and provides an electrically conductive path between the first electrode 330 and the third electrode 340. That is, electrical current flows form the first electrode 330 to the third electrode 340 via the flow of electrons from the first electrode 230, through the semiconductor device 300, through the second electrode 335, through the MIO bonding layer 320, through the electrically conductive layer 342 to the third electrode 340. It should be understood that electrical current will also flow through any bonding layers and/or intermetallic layers disposed between the MIO bonding layer 320 and the semiconductor device 300 and/or between the MIO bonding layer 320 and the electrically conductive layer 342.

Also noted above are the interconnected hollow spheres 325 of the MIO bonding layer 320. Accordingly, the MIO bonding layer 320 has an open porous structure through which fluid can flow and the MIO bonding layer 320 may be part of a cooling fluid circuit for the power electronics assembly 30. Particularly, in embodiments, a cooling fluid circuit (not labeled) includes a cooling fluid inlet 350 extending from the bottom surface 314 to the top surface 312 of the substrate 310 and the bottom surface 324 of the MIO bonding layer 320, an internal cooling fluid chamber 390, and a pair of cooling fluid outlets 362, 364 extending from the top surface 312 to the bottom surface 314 of the substrate 310. The internal cooling fluid chamber 390 comprises the interconnected hollow spheres 325 of the MIO bonding layer 320 and a pair of outlet cooling chambers 392, 394. As depicted by the arrows in FIG. 4, a cooling fluid 'F' may be included and flow into the power electronics assembly 30 through the cooling fluid inlet 350 into the MIO bonding layer 320 through the bottom surface 324. The semiconductor device 300 prevents the cooling fluid F from flowing through the top surface 322 of the MIO bonding layer 320 thereby ensuring that the cooling fluid flows through the MIO bonding layer 320 to a first end 326 and a second end 328 oppositely disposed from the first end 326. The cooling fluid F exits the MIO bonding layer 320 via the first end 326 and the second end 328 and enters the pair of outlet cooling chambers 392, 394, respectively, before exiting the power electronics assembly 30 via the pair of cooling fluid outlets 362, 364, respectively. It should be understood that flow of the cooling fluid F through the cooling fluid circuit is configured to remove heat from the semiconductor device 300.

Accordingly, the MIO bonding layer 320 provides a thermal stress compensation layer between the semiconductor device 300 and the substrate 310, an electrically conductive path between the first electrode 330 and the third electrode 340, and a cooling layer for the semiconductor device 300.

Figure 5A:
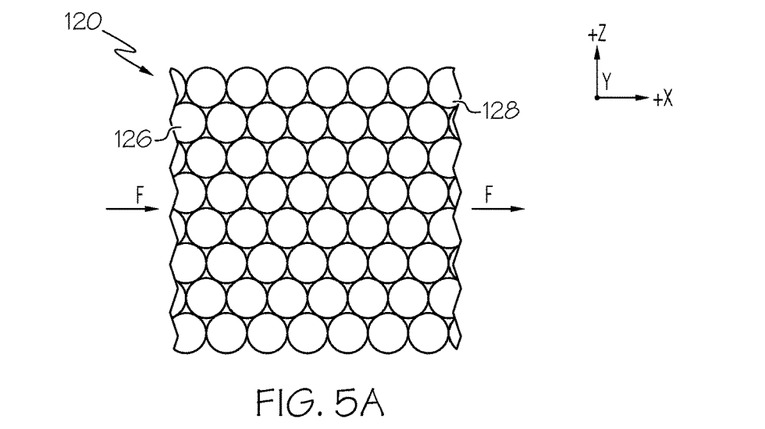
FIG. 5A schematically depicts cooling fluid flowing through a metal inverse opal layer that provides electrical contact between electrodes and cooling of a power semiconductor device according to one or more embodiments shown and described herein.
Figure 5B:
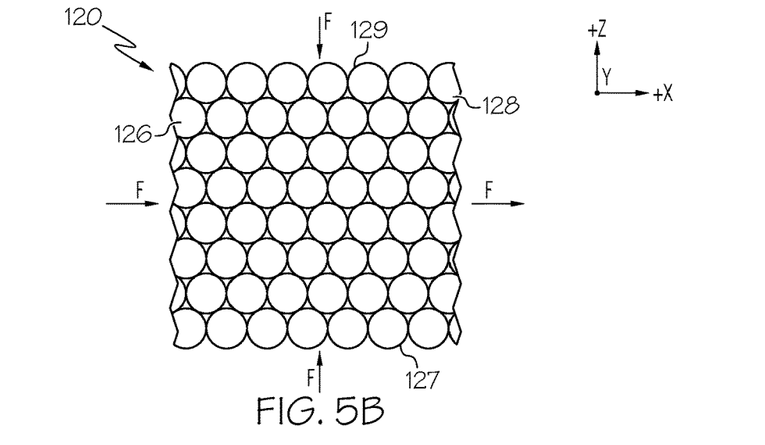
FIG. 5B schematically depicts cooling fluid flowing through a metal inverse opal layer that provides electrical contact between electrodes and cooling of a power semiconductor device according to one or more embodiments shown and described herein.
Figure 5C:
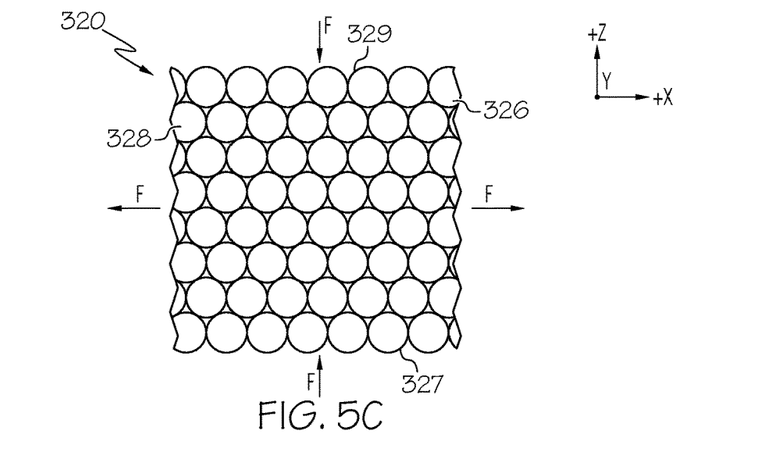
FIG. 5C schematically depicts cooling fluid flowing through a metal inverse opal layer that provides electrical contact between electrodes and cooling of a power semiconductor device according to one or more embodiments shown and described herein.

While FIGS. 1 and 3 depict cooling fluid F flowing into one end of the MIO bonding layers 120, 220 and flowing out of another end of the MIO bonding layers 120, 220, respectively, and FIG. 4 depicts cooling fluid F flowing out of two ends of the MIO bonding layer 320, it should be understood that other flow paths, cooling fluid configurations, etc., may be utilized with the MIO layers and power electronic assemblies described herein. For example, non-limiting cooling fluid flow paths through the MIO bonding layers 120, 320 are schematically depicted in FIGS. 5A-5C. Particularly, a simple cooling fluid circuit configuration comprising the MIO bonding layer 120 with a single fluid inlet through the first end 126 and a single fluid outlet through the second end 128 (such as described for the power electronics assemblies 10, 20 above) is schematically depicted in FIG. 5A. A modification of the simple cooling fluid circuit configuration depicted in FIG. 5A is schematically depicted in FIG. 5B with cooling fluid F entering the MIO bonding layer 120 through the first end 126, a first side 127 and a second side 129, and exiting the MIO bonding layer 120 through the second end 128. Also, FIG. 5C schematically depicts a cooling fluid configuration comprising the MIO bonding layer 320 with cooling fluid F entering the MIO bonding layer 320 through a first side 327 and a second side 329, and exiting the MIO bonding layer 320 through the first end 326 and the second end 328. It should be understood that other cooling paths and cooling fluid circuit configurations through MIO layers and power electronic assemblies described herein may be utilized such that cooling fluid flows into a MIO bonding layer through at least one of a first end and a first side of the MIO bonding layer and exits the MIO bonding layer through at least one of a second end and a second side of the MIO bonding layer.

Figure 6:
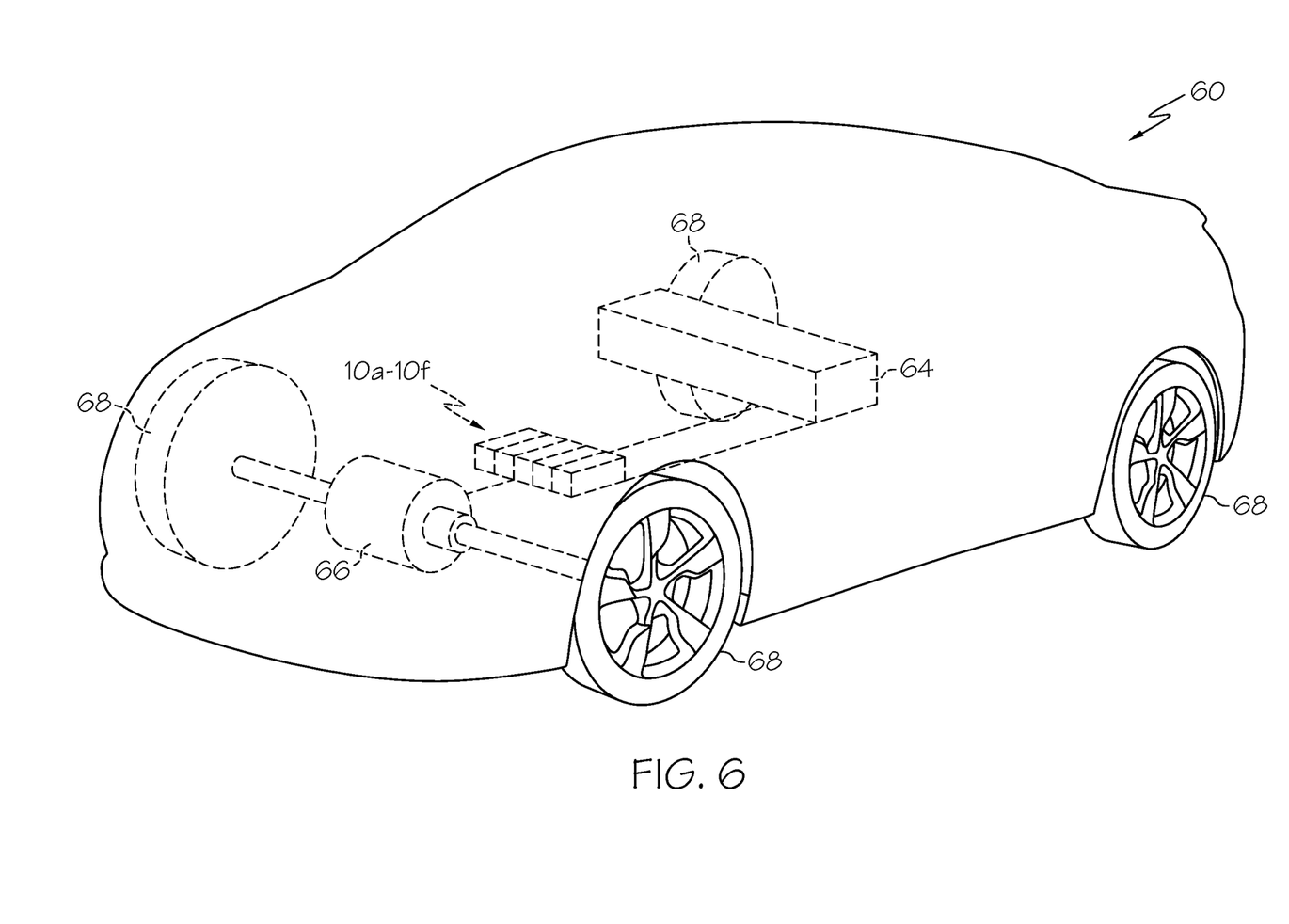
FIG. 6 schematically depicts a vehicle having a plurality of power electronics assemblies according to one or more embodiments shown and described herein.

As stated above, the substrates and power electronics assemblies described herein may be incorporated into an inverter circuit or system that converts direct current electrical power into alternating current electrical power and vice versa depending on the particular application. For example, in a hybrid electric vehicle application as illustrated in FIG. 6, several power electronics assemblies 10a-10f may be electrically coupled together to form a drive circuit that converts direct current electrical power provided by a bank of batteries 64 into alternating electrical power that is used to drive an electric motor 66 coupled to the wheels 68 of a vehicle 60 to propel the vehicle 60 using electric power. The power electronics assemblies 10a-10f used in the drive circuit may also be used to convert alternating current electrical power resulting from use of the electric motor 66 and regenerative braking back into direct current electrical power for storage in the bank of batteries 64.

Power semiconductor devices utilized in such vehicular applications may generate a significant amount of heat during operation, which require bonds between the semiconductor devices and substrates that can withstand higher temperatures and thermally-induced stresses due to CTE mismatch. The MIO bonding layers described and illustrated herein may compensate for the thermally-induced stresses generated during thermal bonding of the semiconductor devices to the substrate by manageably controlling the thermal expansion and/or stiffness experienced by the layers of the substrate and semiconductor devices while also providing a compact package design. The MIO bonding layers may also provide an electrically conductive path between a pair of electrodes and provide a cooling layer for cooling of semiconductor devices during operation of the power electronics devices.

It should now be understood that the MIO bonding layers incorporated into the power electronics assemblies and vehicles described herein may be utilized to reduce thermally-induced stresses due to CTE mismatch without the need for additional interface layers, provide an electrically conductive pathway between electrodes and provide a cooling layer for semiconductor devices thereby providing for a more compact package design with reduced thermal resistance.

It is noted that the terms "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. Also, the terms "top" and "bottom" as used herein refer to orientations and configurations disclose in the drawings and not meant to provide an absolute definition or orientation of a component disclosed herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics assembly comprising:
   a substrate, a semiconductor device and a metal inverse opal (MIO) bonding layer positioned between and bonded to the substrate and the semiconductor device;
   a first electrode disposed on a first surface, a second electrode disposed on a second surface, and a third electrode disposed on a third surface, wherein the first surface is a top surface of the semiconductor device, the second surface is a bottom surface of the semiconductor device, the third surface is spaced apart from the second surface of the semiconductor device and the second electrode is in electrical communication with the third electrode through the MIO bonding layer; and
   a cooling fluid circuit comprising a cooling fluid inlet, a cooling fluid outlet and the MIO bonding layer, the cooling fluid circuit configured for a cooling fluid to enter the power electronics assembly through the cooling fluid inlet, flow through the MIO bonding layer, and exit the power electronics assembly through the cooling fluid outlet.

2. The power electronics assembly of claim 1, wherein the MIO bonding layer is positioned between and transient liquid phase bonded to the bottom surface of the semiconductor device and a top surface of the substrate.

3. The power electronics assembly of claim 1, wherein the third surface is a bottom surface of the substrate.

4. The power electronics assembly of claim 3, further comprising at least one electrically conductive through via extending through the substrate from the MIO bonding layer to the second electrode.

5. The power electronics assembly of claim 3, wherein the cooling fluid inlet and the cooling fluid outlet extend through the substrate and the cooling fluid circuit is configured for fluid to flow into the MIO bonding layer through at least one of a first end and a first side of the MIO bonding layer and exit the MIO bonding layer through at least one of a second end and a second side of the MIO bonding layer.

6. The power electronics assembly of claim 3, further comprising a frame extending from a top surface of the substrate and at least one seal positioned between the frame and the semiconductor device, wherein the cooling fluid inlet and the cooling fluid outlet extend between the frame and the semiconductor device.

7. The power electronics assembly of claim 6, wherein the cooling fluid circuit is configured for fluid to flow into the MIO bonding layer through a least one of a first end and a first end of the MIO bonding layer and exit the MIO bonding layer through at least one of a second end and a second side of the MIO bonding layer.

8. The power electronics assembly of claim 1, further comprising a frame extending from a top surface of the substrate and an electrically conductive layer extending from between the substrate and the MIO bonding layer to a top surface of the frame, wherein the second surface is the electrically conductive layer disposed on the top surface of the frame.

9. The power electronics assembly of claim 8, wherein the cooling fluid inlet extends through the substrate and the cooling fluid circuit is configured for fluid to flow through the cooling fluid inlet into a bottom surface of the MIO bonding layer and exit the MIO bonding layer through at least one end of the MIO bonding layer.

10. A power electronics assembly comprising:
a substrate comprising a top surface and a bottom surface;
a frame disposed on the top surface of the substrate;
a semiconductor device extending across the substrate;
a metal inverse opal (MIO) bonding layer positioned between and bonding together the substrate and the semiconductor device;
a first electrode disposed on a first surface, a second electrode disposed on a second surface, and a third electrode disposed on a third surface, wherein the first surface is a top surface of the semiconductor device, the second surface is a bottom surface of the semiconductor device, the third surface is spaced apart from the second surface of the semiconductor device, and the second electrode is in electrical communication with the third electrode through the MIO bonding layer; and
a cooling fluid circuit comprising a cooling fluid inlet, a cooling fluid outlet, and the MIO bonding layer.

11. The power electronics assembly of claim 10, wherein the third electrode is disposed on the bottom surface of the substrate and at least one electrically conducting through via extends through the substrate from the MIO bonding layer to the third electrode.

12. The power electronics assembly of claim 11, wherein the cooling fluid inlet extends through the substrate and the cooling fluid circuit is configured for fluid to flow into the MIO bonding layer through at least one of a first end and a first side of the MIO bonding layer and exit the MIO bonding layer through at least one of a second end and a second side of the MIO bonding layer.

13. The power electronics assembly of claim 11, further comprising at least one seal positioned between the frame and the semiconductor device, wherein the cooling fluid inlet and the cooling fluid outlet extend between the frame and the semiconductor device, and the cooling fluid circuit is configured for fluid to flow into the MIO bonding layer through at least one of a first end and a first side of the MIO bonding layer and exit the MIO bonding layer through at least one of a second end and a second side of the MIO bonding layer.

14. The power electronics assembly of claim 10, further comprising an electrically conductive layer extending from between the MIO bonding layer and the substrate to a top surface of the frame, wherein the second electrode is disposed on the electrically conductive layer disposed on the top surface of the frame.

15. The power electronics assembly of claim 14, wherein the cooling fluid inlet extends through the substrate and the cooling fluid circuit is configured for fluid to flow through the cooling fluid inlet into a bottom surface of the MIO bonding layer and exit the MIO bonding layer through at least one end of the MIO bonding layer.

16. The power electronics assembly of claim 14, further comprising a seal disposed between the frame and the semiconductor device.

17. A process for manufacturing a power electronics assembly comprising:
positioning a metal inverse opal (MIO) bonding layer between a substrate and a semiconductor device to provide a substrate/semiconductor device assembly;
heating the substrate/semiconductor device assembly to a transient liquid phase (TLP) sintering temperature between about 280° C. and 350° C. and TLP bonding the MIO bonding layer between and to the substrate and the semiconductor device;
cooling the substrate/semiconductor device assembly from the TLP sintering temperature to ambient temperature; and
attaching a first electrode to a first surface, a second electrode to a second surface and a third electrode to a third surface to form the power electronics assembly, wherein the first surface is a top surface of the semiconductor device, the second surface is a bottom surface of the semiconductor device, the third surface is spaced apart from the second surface, and the second electrode is in electrical communication with the third electrode through the MIO bonding layer.

18. The process of claim 17, wherein the third surface is a bottom surface of the substrate, the substrate comprises at least one electrically conductive through via extending through the substrate, and the bottom surface of the MIO bonding layer is in electrical communication with the third electrode through the at least one electrically conductive through via.

19. The process of claim 17, further comprising flowing a cooling fluid through a cooling fluid circuit of the power electronics assembly, the cooling fluid circuit comprising a cooling fluid inlet, a cooling fluid outlet, and the MIO bonding layer.

20. The process of claim 19, further comprising attaching a frame to a top surface of the substrate, wherein the third surface is an electrically conductive layer disposed on a top surface of the frame and the cooling fluid circuit is configured for the cooling fluid to flow through the cooling fluid inlet into a bottom surface of the MIO bonding layer and exit the MIO bonding layer through at least one end of the MIO bonding layer.

* * * * *